United States Patent [19]

Ruegg

[11] Patent Number: 5,450,024
[45] Date of Patent: Sep. 12, 1995

[54] ECL TO CMOS SIGNAL CONVERTER CIRCUIT INCLUDING TOGGLE-FAULT DETECTION

[75] Inventor: Eugen H. Ruegg, Cary, N.C.

[73] Assignee: Alcatel Network Systems, Inc., Richardson, Tex.

[21] Appl. No.: 184,231

[22] Filed: Jan. 19, 1994

[51] Int. Cl.$^6$ ............... H03K 19/0175; H03K 19/007
[52] U.S. Cl. ...................... 326/66; 326/77; 326/14; 326/16; 326/94; 327/333
[58] Field of Search ............... 307/442, 443, 296.4, 307/542.1, 272.3, 475; 371/29.5, 64; 375/26, 34, 36; 326/14, 16, 77, 66, 94; 327/333, 384

[56] References Cited

U.S. PATENT DOCUMENTS

| | | | |
|---|---|---|---|
| 4,891,535 | 1/1990 | Etheridge | 307/475 |
| 4,931,667 | 6/1990 | Pfennings et al. | 307/296.4 |
| 5,136,189 | 8/1992 | Demaris | 307/475 |
| 5,216,674 | 6/1993 | Peter et al. | 371/29.5 |
| 5,264,745 | 11/1993 | Woo | 307/443 |
| 5,304,856 | 4/1994 | Rainal | 307/270 |

FOREIGN PATENT DOCUMENTS 204144 10/1985 Japan.

Primary Examiner—David R. Hudspeth
Assistant Examiner—Richard Roseen
Attorney, Agent, or Firm—Baker & Botts

[57] ABSTRACT

An ECL to CMOS signal converter circuit including built-in toggle-fault detection circuitry and method of conversion are provided in which an RF transformer is used to translate ECL level digital signals to CMOS level signals. A diode biasing circuit shifts the average DC level of the CMOS level signals in a positive direction to avoid signal undershoot. An AC peak detection circuit is connected to the inactive leg of the RF transformer to monitor toggling of the ECL level input signal lines. A DC comparator circuit compares the detected peak voltage with a predetermined threshold voltage, and generates an alarm signal representing a toggle-fault whenever the detected peak voltage is lower than the predetermined threshold.

20 Claims, 3 Drawing Sheets

ECL TO CMOS SIGNAL CONVERTER CIRCUIT INCLUDING TOGGLE-FAULT DETECTION

TECHNICAL FIELD OF THE INVENTION

This invention relates generally to electronic circuits, and more particularly, to ECL to CMOS converter circuitry including built-in toggle-fault detection.

BACKGROUND OF THE INVENTION

In designing circuit components for telecommunications systems, such as, for example, a 1603 SM Add/-Drop Multiplexer subsystem manufactured by Alcatel Network Systems for use in a Synchronous Optical Network (SONET) system, a primary goal has been to minimize the subsystem's size, complexity and power consumption while maximizing its signal transport capabilities and operational performance. However, increased customer intolerance of interrupted service has shifted a significant amount of design emphasis to increased survivability of the overall system. Consequently, increased design emphasis is being given to early recognition of degraded or interrupted signals and responsive, automatic rerouting of traffic over redundant or standby circuitry.

In designing logic circuits for high speed telecommunications systems, such as, for example, a CLK 101 clock circuit card for a 1603 SM Add/Drop Multiplexer, it is most advantageous to convert incoming ECL-balanced digital signals (e.g., a DS2 signal and its complement) to CMOS level signals to minimize power consumption, and effect an efficient interface between the two signal levels to maximize switching speed. For example, as illustrated in FIG. 1, a conventional technique uses a type 10H125 ECL-to-TTL converter chip manufactured by Motorola to convert an incoming ECL-balanced signal to a TTL level signal, which is then input to an ACT 74 CMOS logic stage manufactured by Motorola. However, this technique is relatively limited and inefficient, because the 10H125 chips perform adequately only as an interface stage between ECL logic and TTL or "ACT" type CMOS logic gates, but inadequately as an interface with standard CMOS logic gates (e.g., "AC" CMOS gates) or Application Specific Integrated Circuits (ASICs) having CMOS level input stages.

Also illustrated in FIG. 1 is a conventional use of toggle-fault detection circuitry to help increase the survivability of the overall telecommunications system. Generally, the toggle-fault detection circuitry generates an alarm signal when one or both of the digital input signals is significantly degraded or missing altogether. Typically, when both digital signals input on lines 11 and 12 are "toggling" (i.e., switching properly between logic state "1" and "0"), this condition is defined as "full toggling" and no "toggle-fault" alarm signal is required to be generated. However, if either of the digital input signals is "stuck" at logic "1" or "0" ("half-toggling" condition), or both input signals are "stuck" ("non-toggling" condition), then a toggle-fault alarm signal is generated. In response to this alarm signal, the system is designed to reroute signal traffic to a backup or standby circuit card. Specifically, referring to FIG. 1, each of the digital signals input to converter circuit 100 is coupled to an input connection of ECL to TTL converter 110. One input signal is also coupled to an input connection of ECL to TTL converter 130, while the other signal is coupled to the complementary input connection of ECL to TTL converter 140. If one or both of the input lines fails to "toggle" then the signal degradation is accompanied by a decreased output signal from respective converter 130 or 140, or both. A signal decrease at output connection Q2 of converter 130 is detected by clock detection circuit 152, and a signal decrease at output connection Q3 of converter 140 is detected by clock detection circuit 154. Accordingly, a toggle-fault alarm signal is output from a respective clock detection circuit to microprocessor 160, in response to a half-toggle or non-toggle condition detected on the input lines to circuit 100. In response to such an alarm signal, microprocessor 160 generates control signals that are coupled to switching circuits (not explicitly shown), which operate to reroute the signal traffic to bypass the faulty card, and thereby minimize system downtime.

FIG. 2 shows the details of clock detection circuits 152 and 154 of FIG. 1. As illustrated by FIG. 2, a major disadvantage of converter circuit 100 is that a significant number of ("ACT") CMOS gates must be used to provide toggle-fault detection. Since the power consumption of these types of logic gates increases with processing speed, they increase the power consumption of circuit 100 significantly (about 100 to 200 mwatts) because they are toggling at the relatively high rate of 52 Mbits/sec. Also, the use of 10H125 type chips for converters 130 and 140 results in an additional power consumption of about 300–500 mwatts for converter circuit 100.

FIG. 3 illustrates a second conventional technique that is used to convert ECL-balanced signals to CMOS level signals, which also includes toggle-fault detection. Essentially, the signal on each line 11 and 12, input to converter circuit 300 is monitored by an AC-coupled peak detector. A toggle-fault alarm signal is output from either of amplifiers 330 or 340 in a respective detector circuit, if either one of the input lines fails to "toggle" or the "toggling" action of one line is faulty. However, since the ECL signals being monitored on lines 11 and 12 are only approximately 0.8 V p—p, the use of diodes to detect and bias such relatively small signals in such a circuit arrangement is a technique that is extremely sensitive to temperature variations. For example, the forward drop for any diode in circuit 300 can vary up to +/−150 mV as a function of temperature. Therefore, it is extremely difficult to achieve optimum performance of converter circuit 300 over a full range of operating temperatures between −40° C. to 85° C. Furthermore, the relatively high number of discrete components being used for toggle-fault detection adds a substantial amount of power consumption for circuit 300.

SUMMARY OF THE INVENTION

Accordingly, a need exists in the high speed telecommunications industry for an improved ECL to CMOS signal converter circuit including built-in toggle-fault detection, which will increase system survivability and minimize power consumption. In accordance with the present invention, an ECL to CMOS signal converter circuit including toggle-fault detection circuitry and method of conversion are provided in which an RF transformer is used to translate ECL level digital signals to CMOS level signals. A diode biasing circuit shifts the average DC level of the CMOS level signals in a positive direction to avoid signal undershoot. An AC peak detection circuit is connected to the inactive leg of the RF transformer to monitor toggling of the ECL level input signal lines. A DC comparator circuit compares the detected peak voltage with a predetermined threshold voltage, and generates an alarm signal representing a toggle-fault whenever the detected peak voltage is lower than the predetermined threshold.

An important technical advantage of the present invention is that high speed conversion of ECL level digital signals with toggle-fault detection is accomplished with a significantly smaller number of circuit components than prior conversion circuits. Consequently, the power consumption of the present invention is significantly lower than that of the prior circuits, and the switching speed of the present invention is significantly higher.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1–5 of the drawings, like numerals being used for like and corresponding parts of the various drawings.

Figure 1:
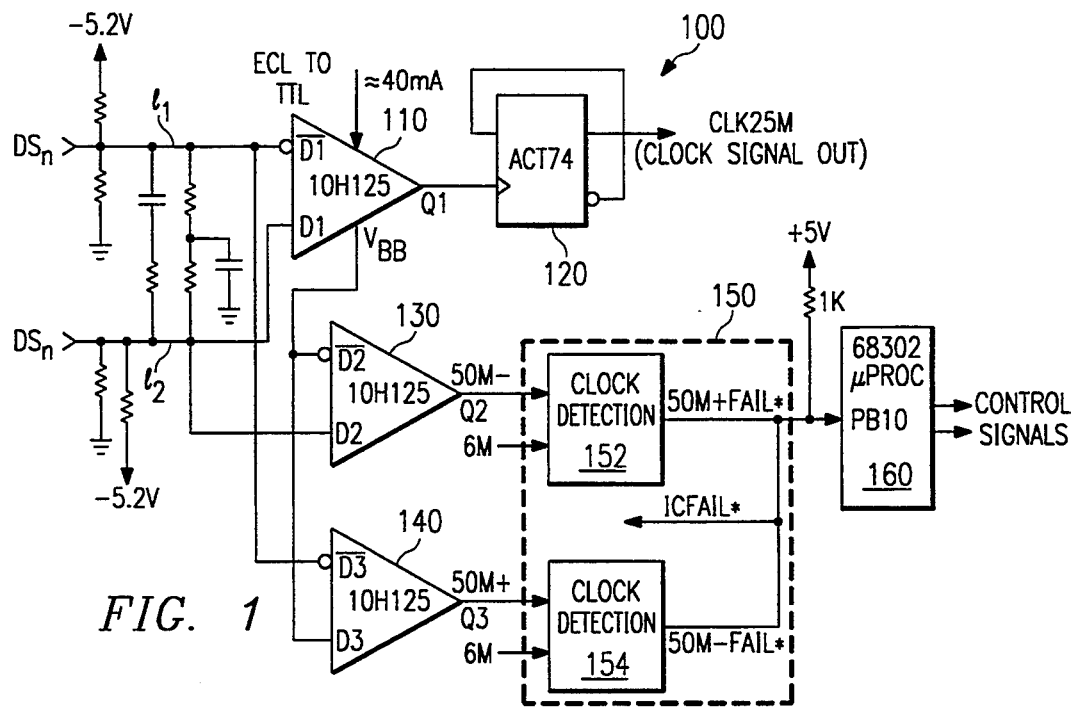
FIG. 1 illustrates an electrical schematic circuit diagram of a conventional circuit used to convert an ECL-balanced signal to a TTL level signal, which includes one type of toggle-fault detection circuit.
Figure 2:
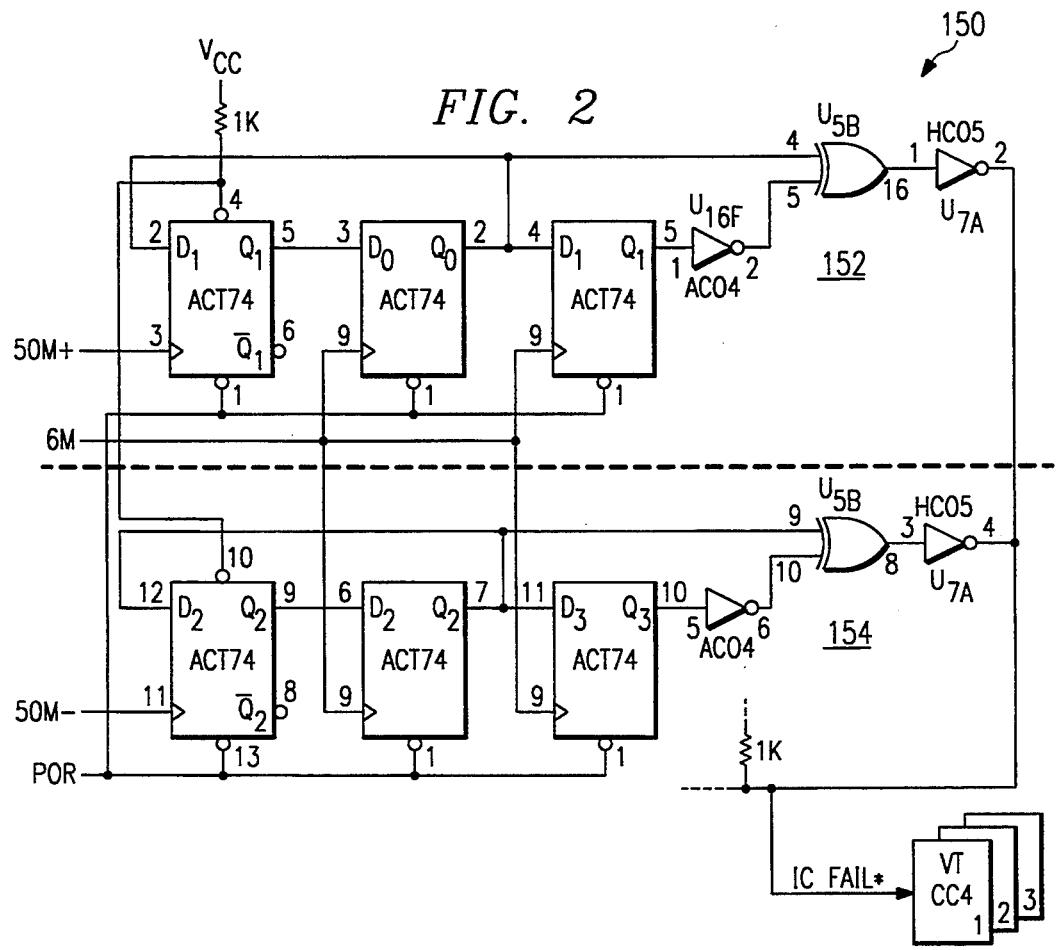
FIG. 2 is an electrical schematic circuit diagram of the details of clock detection circuits 152 and 154 shown in FIG. 1.
Figure 3:
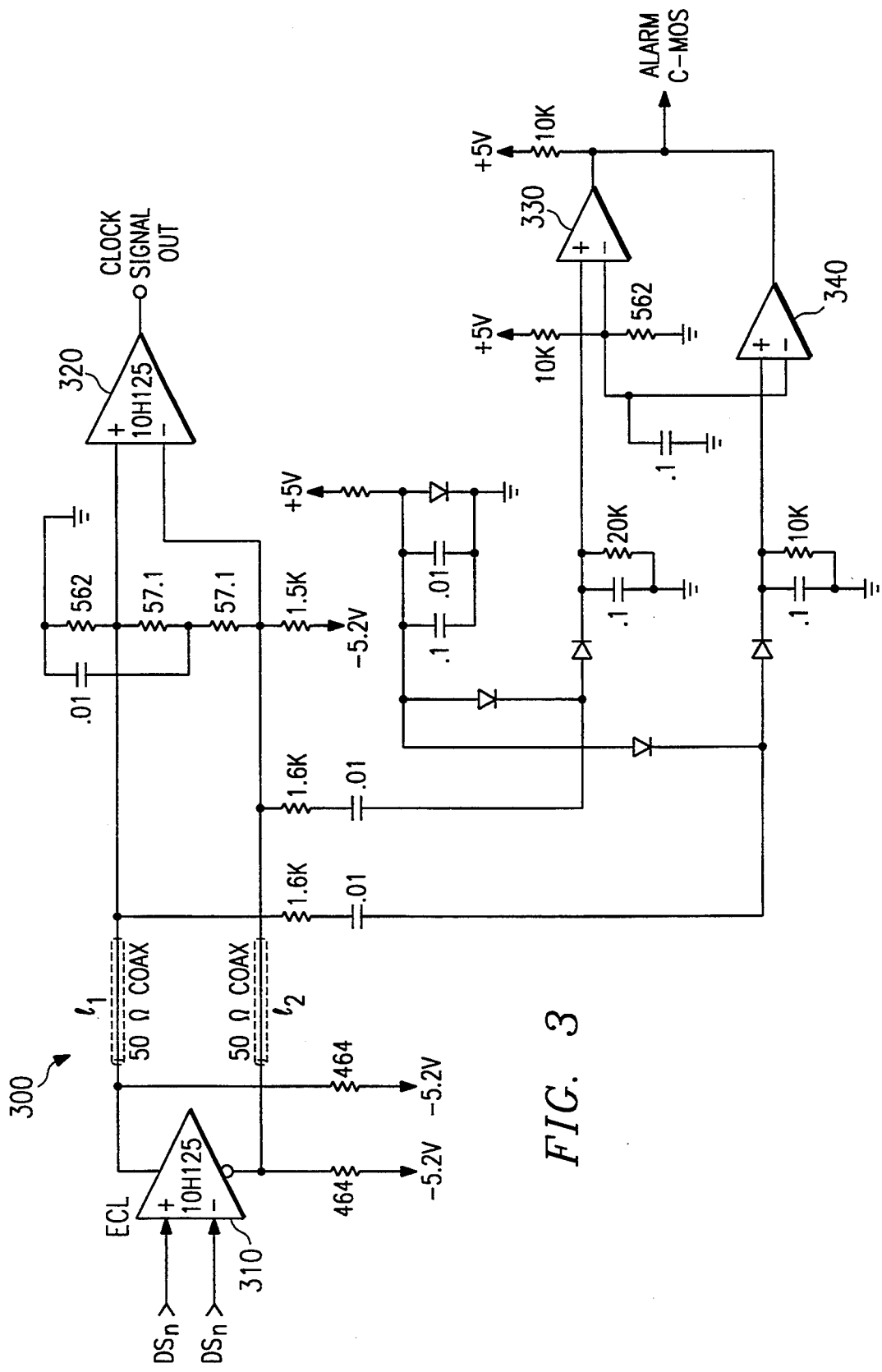
FIG. 3 illustrates an electrical schematic circuit diagram of a second conventional circuit used to convert an ECL-balanced signal to a TTL level signal, which includes a second type of toggle-fault detection circuit.
Figure 4:
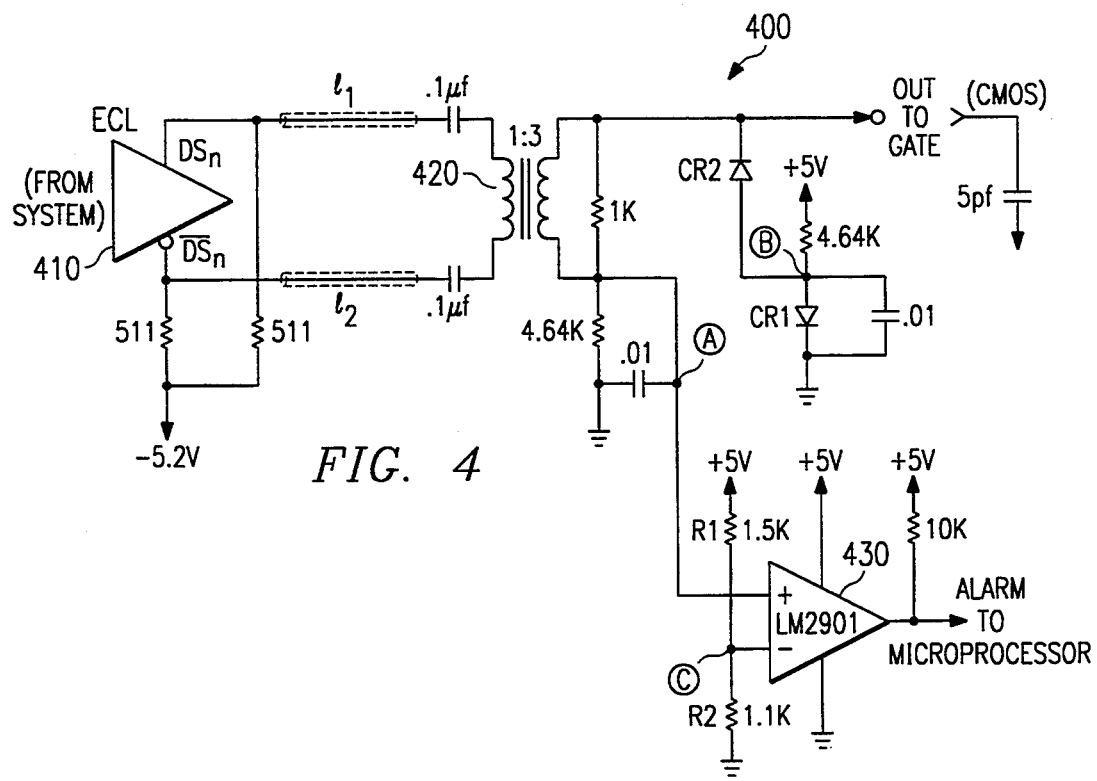
FIG. 4 illustrates an electrical schematic circuit diagram of a preferred embodiment of a circuit to convert ECL-balanced signals to CMOS level signals, including built-in toggle-fault detection circuitry according to the teachings of the present invention.

FIG. 4 illustrates an electrical schematic circuit diagram of a preferred embodiment of a circuit to convert ECL-balanced signals to CMOS level signals, including built-in toggle-fault detection circuitry according to the teachings of the present invention. Essentially, the present invention uses an RF transformer (AC-coupled) to amplify the incoming ECL signals to CMOS levels and also provide a self-biasing level for the output signal, which optimizes the circuit's performance for CMOS gate switching applications. A "self-biasing" DC lead on the inactive leg of the transformer is connected to a built-in toggle-fault detector circuit, which functions to minimize the parts count and overall power consumption of the circuit.

Specifically, the digital signals input to converter circuit 400 are coupled via 50 ohm transmission lines, 11 and 12, from ECL-level input stage 410 to the primary leads of RF transformer 420. The switching rate of the input signals is about 52 Mbits/sec. In a preferred embodiment, RF transformer 420 may be a 1:3 voltage ratio transformer (impedance ratio of 1:9), such as, for example, a T9-1 transformer manufactured by Mini-Circuits, Inc. Typically, transformer 420 will amplify the ECL-level input signals from about 1.6 V peak-to-peak to about 4.8 V peak-to-peak. Consequently, the output signal from circuit 400 to the CMOS gate will be at an acceptable CMOS signal level. In high speed switching applications, typical ECL level signals range from about $-1$ V to $-2$ V, and acceptable CMOS level signals range from about 0 V to $+5$ V. However, without any particularized treatment of the amplified ECL signals at the secondary of transformer 420 (no diodes used), the output signals to the CMOS gate could swing in a negative direction as low as $-2.4$ V ($\frac{1}{2}$ the p—p voltage), which is not within the acceptable range of CMOS input signal voltage levels. Consequently, a "self-biasing" capability is provided in circuit 400 by diodes CR1 and CR2 to shift the "center" or crossover point of the output signals in a positive direction so that the negative swings of the output signal will not "undershoot" and go below the zero voltage level. The present invention thereby minimizes signal distortion at the output of circuit 400. For example, diode CR1 biases the DC level at node B to approximately one diode drop above ground. Diode CR2 biases the DC level at node A to about one diode drop below the level fixed at node B, or approximately at ground. Since the secondary winding of transformer 420 has a very low DC resistance, the DC level at the output connection to the CMOS gate is also fixed approximately at ground. It follows, therefore, that the resulting output signals coupled to the CMOS gate will not go negative (undershoot) and will always be maintained within the 0 V to $+4.8$ V range, which is an optimum range for CMOS level switching applications. In a preferred embodiment, diodes CR1 and CR2 are identical BAW56 diodes manufactured by Siemens.

For toggle-fault detection, the DC bias at node B is fixed at about $+0.6$ V and node A to about 0 V. When the input lines, 11 and 12, are both "toggling," the diode "self-biasing" circuitry shifts the "center" point of the output signal positive by approximately $\frac{1}{2}$ of the peak-to-peak toggling voltage. If the toggling voltage at the transformer's secondary is about 4.8 $V_{pp}$, then the "center" point of the output signal is shifted to approximately $\frac{1}{2}(4.8$ V$)$, or about 2.4 V for a full-toggling condition. This voltage is seen by node A. If, on the other hand, neither of the input lines is "toggling" then the "self-biasing" arrangement of the present invention sets the DC level at the output connection to the lowest possible level, or about 0 V (one diode drop below node B). This signal level of 0 V will force a logic "zero" into the succeeding CMOS gate. In any event, the present invention is not intended to be limited to any particular DC bias level at node A, since the DC level at node B may be shifted to any level desired to provide an optimal "self-biasing" point for circuit 400 (e.g., see FIG. 5 below).

Alternatively, if one of input lines 11 or 12 fails to toggle (e.g., a line is "stuck" at zero), the peak-to-peak toggle voltage present at the output to the CMOS gate is $\frac{1}{2}$ the full peak-to-peak toggle voltage. This change in the peak-to-peak toggle voltage level is also seen at node A. Consequently, as described in detail below, the change in the DC level at node A may be used to detect a toggle-fault. Specifically, if both input lines 11 and 12 are toggling properly, then (as discussed above) the peak voltage detected at node A is 2.4 V. The voltage level set at node C by resistors R1 and R2 is approximately 2.2 V. Node A is connected to the positive input connection of comparator 430, and node C is connected to the negative input connection of comparator 430. In a preferred embodiment, comparator 430 may be ¼ of an LM2901 comparator manufactured by Motorola. Consequently, for a full toggle condition, the voltage present at the positive input connection to comparator 430 is greater than the voltage at the negative input connection, and no alarm signal is output from the comparator. For a half-toggle condition (e.g., one of lines 11 or 12 is stuck at "1" or "0"), the peak voltage present at node A and the positive input connection of comparator 430 is ½ that for a full toggle voltage, or 1.2 V. Consequently, the voltage present at the negative input connection of the comparator (+2.2 V) is greater than that present at the positive input connection (+1.2 V), and an alarm signal is generated at the comparator's output. If neither of the input lines is toggling, then the voltage present at node A and the positive input connection of comparator 430 is about 0 V, which is a low enough voltage to generate an alarm signal from the comparator. In accordance with the teachings of the invention, the present ECL to CMOS converter circuit including toggle-fault detection consumes approximately only 30 mW of power as opposed to 300 mW to 500 mW for prior conversion circuits. Additionally, the present converter circuit uses only ¼ of a comparator chip, while prior converter circuits use upwards of 4 to 5 chips. Consequently, the present ECL to CMOS signal converter circuit including toggle-fault detection typically operates about 50% faster, about 25° F. cooler, consumes about 20 times less power, and includes about 5 times fewer chips, than prior ECL to CMOS signal conversion circuits including toggle-fault detection.

Figure 5:
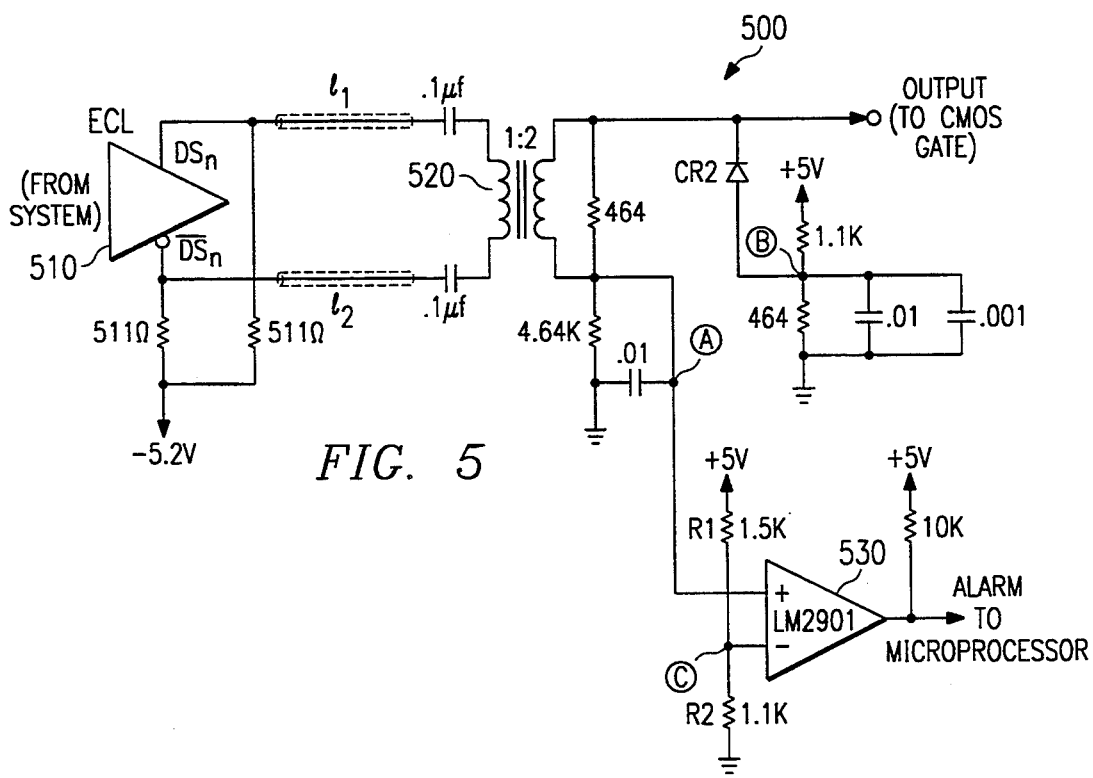
FIG. 5 illustrates an electrical schematic circuit diagram of a second embodiment of a circuit to convert ECL-balanced signals to CMOS level signals, including built-in toggle-fault detection circuitry according to the teachings of the present invention.

FIG. 5 illustrates an electrical schematic circuit diagram of a second embodiment of a circuit to convert ECL-balanced signals to CMOS level signals, including built-in toggle-fault detection circuitry according to the teachings of the present invention. Generally, the embodiment illustrated in FIG. 5 uses a 1:2 voltage ratio RF transformer, instead of a 1:3 transformer as illustrated by the embodiment disclosed in FIG. 4. Consequently, the signal amplification factor of converter circuit 400 in FIG. 4 is higher than that of converter circuit 500 in FIG. 5. Therefore, given the potentially higher output signal voltages in converter circuit 400 than in converter circuit 500, converter circuit 400 may be more reliable for certain high speed switching applications than converter circuit 500. However, the use of a 1:2 transformer in converter circuit 500 of FIG. 5 illustrates that the present invention is not intended to be limited to a particular transformer ratio.

Specifically, referring to FIG. 5, the DC bias level at node B is fixed to +1.5 V. Transformer 520 is a 1:2 voltage ratio RF transformer having a 1:4 impedance ratio. In the embodiment of FIG. 5, transformer 520 may be a T4-1 transformer manufactured by Mini-Circuits, Inc. With no toggling on input lines 11 and 12, the DC level at node A is approximately one diode drop lower than the DC level at node B, or about +1 V. Given the very low DC resistance of transformer 520, the DC level at the output connection of converter circuit 500 is also about +1 V (non-toggling condition). This voltage is low enough to force a logic "0" into the succeeding CMOS gate. Alternatively, with full toggling on both input lines, the DC level at node A is shifted positive by ½ the peak-to-peak toggle voltage up to +2.6 V. Specifically, for a peak-to-peak toggle voltage at the secondary of transformer 520 of 3.2 V, then the DC level at node A equals ½ (3.2 V) +1 V, or 2.6 V. For a half-toggling condition (e.g., one line is stuck at "0" or "1"), then the peak-to-peak toggle voltage at the secondary winding is ½ the full toggle voltage, or 1.6 $V_{pp}$. Consequently, for a half-toggling condition, the DC level at node A is approximately equal to ½(1.6 V) +1 V, or about 1.8 V.

The toggle-fault detection alarm threshold, or the DC level set at node C, is set at about +2.2 V in the embodiment illustrated by FIG. 5. Consequently, for a full toggle condition on lines 11 and 12, the +2.6 V present at node A and the positive input connection of comparator 530, is higher than the threshold setting of +2.2 V at the negative input connection of the comparator, and no toggle-fault alarm signal is generated. For a half-toggle condition, the +1.6 V present at node A and the positive input connection of comparator 530, is lower than the threshold setting of +2.2 V, and a toggle-fault alarm signal is generated by the comparator. Additionally, if no input line is toggling, then the +1 V present at node A and the positive input connection of the comparator, is lower than the threshold setting, and a toggle-fault alarm signal is also generated.

As a result of the above, although the invention has been described with reference to the above embodiments, its description is not meant to be construed in a limiting sense. Various modifications of the disclosed embodiments, as well as alternative embodiments of the invention will become apparent to persons skilled in the art upon reference to the above description. It is therefore contemplated that the appended claims will cover such modifications that fall within the true scope of the invention.

What is claimed is:

1. An ECL to CMOS converter circuit for use in a high speed telecommunications system, comprising:
    a first circuit operable to receive a first signal from emitter-coupled logic (ECL) circuitry in the high speed telecommunications system;
    a second circuit having an input connected to said first circuit and operable to transform said first signal to a CMOS level signal at an output;
    a third circuit connected to said output and operable to shift the center of said CMOS level signal to avoid undershoot;
    a fourth circuit connected to said output and operable to detect a predetermined level of said CMOS level signal; and
    a fifth circuit operable to indicate a detection of said predetermined level of said CMOS level signal.

2. The ECL to CMOS converter circuit according to claim 1, wherein said second circuit comprises an RF transformer circuit.

3. The ECL to CMOS converter circuit according to claim 1, wherein said third circuit comprises a diode peaking circuit.

4. The ECL to CMOS converter circuit according to claim 1, wherein said fourth circuit comprises an AC peak level detector circuit.

5. The ECL to CMOS converter circuit according to claim 1, wherein said fifth circuit comprises a signal comparator circuit.

6. The ECL to CMOS converter circuit according to claim 1, wherein said fourth and fifth circuits comprise a toggle-fault detection circuit.

7. A method of converting an ECL level signal to a CMOS level signal in a high speed telecommunications system, comprising the steps of:
  receiving a first signal from emitter-coupled logic (ECL) circuitry in the high speed telecommunications system at an input;
  transforming said first signal to the CMOS level signal at an output;
  shifting the center of the CMOS level signal to avoid undershoot;
  detecting a predetermined level of the CMOS level signal; and
  indicating a detection of said predetermined level of the CMOS level signal.

8. The method of claim 7, wherein said transforming step further comprises the step of:
  amplifying said ECL level signal to said CMOS level at an output.

9. The method of claim 7, wherein said shifting step further comprises the step of:
  DC biasing said output to shift the center of the CMOS level signal and avoid undershoot.

10. The method of claim 7, wherein said detecting and indicating steps further comprise the steps of:
  detecting and indicating a toggle-fault at said input.

11. A signal conversion circuit for use in a high speed telecommunications system, comprising:
  a first circuit operable to receive a first digital signal in conformance with a first protocol from the high speed telecommunications system;
  an inductive transformer connected to said first circuit and operable to convert said first digital signal to a second digital signal in conformance with a second protocol in said high speed telecommunications system; and
  a third circuit connected to said inductive transformer and operable to detect and indicate at least one of a degradation of said first digital signal and a loss of said first digital signal.

12. The signal conversion circuit according to claim 11, further comprising a diode biasing circuit coupled to said inductive transformer and operable to avoid undershoot of said second digital signal.

13. The signal conversion circuit of claim 11, wherein said protocol of said first digital signal comprises an ECL-balanced signal.

14. The signal conversion circuit of claim 11, wherein said protocol of said second digital signal comprises a CMOS signal level protocol.

15. The signal conversion circuit of claim 11, wherein said third circuit comprises a toggle-fault detection circuit.

16. The signal conversion circuit of claim 11, wherein said third circuit includes an AC peak level detector circuit.

17. The signal conversion circuit of claim 11, wherein said third circuit includes a DC voltage comparator circuit.

18. A method of converting a first digital signal in a first protocol to a second digital signal in a second protocol in a high speed telecommunications system, comprising the steps of:
  receiving the first digital signal in conformance with the first protocol from the high speed telecommunications system;
  inductively transforming the first digital signal to the second digital signal in conformance with the second protocol in the high speed telecommunications system; and
  detecting and indicating at least one of a degradation of the first digital signal and a loss of the first digital signal.

19. The method of claim 18, wherein the transforming step further comprises the step of:
  amplifying the first digital signal for conformance with the second protocol.

20. The method of claim 18, wherein the detecting and indicating steps further comprise the steps of detecting and indicating a toggle-fault condition for said first digital signal.

* * * * *